United States Patent
Wu et al.

(10) Patent No.: US 8,058,150 B2
(45) Date of Patent: Nov. 15, 2011

(54) PARTICLE FREE WAFER SEPARATION

(75) Inventors: Weng-Jin Wu, Hsin-Chu (TW);
Ku-Feng Yang, Dali (TW); Jung-Chih Hu, Yangmei (TW); Wen-Chih Chiou, Miaoli (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 596 days.

(21) Appl. No.: 12/170,494

(22) Filed: Jul. 10, 2008

(65) Prior Publication Data

US 2010/0009518 A1    Jan. 14, 2010

(51) Int. Cl.
*H01L 21/00* (2006.01)
(52) U.S. Cl. .. 438/460; 438/464; 438/465; 257/E21.599
(58) Field of Classification Search .................. 438/460, 438/464, 465; 257/E21.599
See application file for complete search history.

(56) References Cited

U.S. PATENT DOCUMENTS

| | | | |
|---|---|---|---|
| 6,649,445 B1 * | 11/2003 | Qi et al. | 438/108 |
| 6,908,784 B1 * | 6/2005 | Farnworth et al. | 438/106 |
| 7,199,449 B2 | 4/2007 | Lake | |
| 2006/0068567 A1 | 3/2006 | Beyne et al. | |
| 2006/0079072 A1 | 4/2006 | David et al. | |
| 2010/0233867 A1 * | 9/2010 | Akiyama et al. | 438/464 |

FOREIGN PATENT DOCUMENTS

WO    WO 2008/002790 A1 *    1/2008

\* cited by examiner

*Primary Examiner* — Evan Pert
(74) *Attorney, Agent, or Firm* — Slater & Matsil, L.L.P.

(57) ABSTRACT

A method for singulating semiconductor wafers is disclosed. A preferred embodiment comprises forming scrub lines on one side of the wafer and filling the scrub lines with a temporary fill material. The wafer is then thinned by removing material from the opposite side of the wafer from the scrub lines, thereby exposing the temporary fill material on the opposite side. The temporary fill material is then removed, and the individual die are removed from the wafer.

20 Claims, 5 Drawing Sheets

PARTICLE FREE WAFER SEPARATION

TECHNICAL FIELD

The present invention relates generally to a system and method for manufacturing semiconductor devices and, more particularly, to a system and method for separating semiconductor dies from wafers.

BACKGROUND

Traditionally, after multiple individual dies have been manufactured onto a single semiconductor wafer, the individual die are separated from the wafer by either cutting the wafer with a die saw or else using a nano-scrubbing process. In die sawing a large saw is used to cut the area of the wafer between adjacent dies, essentially cutting the individual die from the wafer. Unfortunately, die sawing, in addition to possible delamination and destruction of the die, also generates particles as the saw cuts through the wafer. These particles can then redeposit and contaminate the individual die, potentially causing bonding failures if the particles are larger than the bonding gap requirements (which may in some cases be less than 1 µm).

A nano-scrubbing process has been developed to singulate the wafer without using a die saw. In this process scrub lines are etched into one side of the wafer between the individual dies and to a depth consistent with the final dimension of the die. A carrier is attached to the wafer over the scrub lines, and the other side of the wafer (opposite the scrub lines) is thinned by grinding until the scrub lines are exposed, thereby singulating the wafer into individual die.

However, nano-scrubbing does not solve the problem of particles. Rather, particles may still be left within the scrub lines after the grinding process. These particles may remain after singulation and may still interfere with subsequent bonding of the die to other devices, thereby driving down the overall yield of wafers.

Accordingly, what is needed is a process of singulating individual die from a semiconductor wafer that prevents the deposition of these particles from occurring to increase the bond yield during subsequent bonding of the die.

SUMMARY OF THE INVENTION

These and other problems are generally solved or circumvented, and technical advantages are generally achieved, by preferred embodiments of the present invention which singulate individual die from a semiconductor wafer.

In accordance with a preferred embodiment of the present invention, a method for separating die from a wafer comprises providing a semiconductor wafer and forming a plurality of openings in a first side of the semiconductor wafer. Once the openings have been formed, the openings are filled with a fill material, and the opposite side of the wafer from the openings are removed so as to expose the fill material. The fill material is then removed from the openings, completing the separation of the wafer.

In accordance with another preferred embodiment of the present invention, a method for singulating a wafer comprises providing a wafer and forming scrub lines on a first side of the wafer. A fill material is then applied to the wafer, filling at least the scrub lines, and a cover is attached to at least the fill material. A portion of the wafer is then removed from a second side of the wafer opposite the first side to expose the fill material. Finally, the fill material is removed from the scrub lines to complete the singulation.

In accordance with yet another preferred embodiment of the present invention, a method for separating a portion of a wafer comprises providing a wafer with a first section and a second section to be separated. The wafer is thinned on the second side, and after the thinning, an opening is etched between the first section and the second section in order to separate the sections from each other.

An advantage of a preferred embodiment of the present invention is the reduction in particles contamination that is an inherent part of many singulation processes. This reduction in particle contamination leads to fewer defects during wafer bonding, and, therefore, increases yield.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely singulating a semiconductor die from a semiconductor wafer. The invention may also be applied, however, to other wafer separation processes.

Figure 1A:
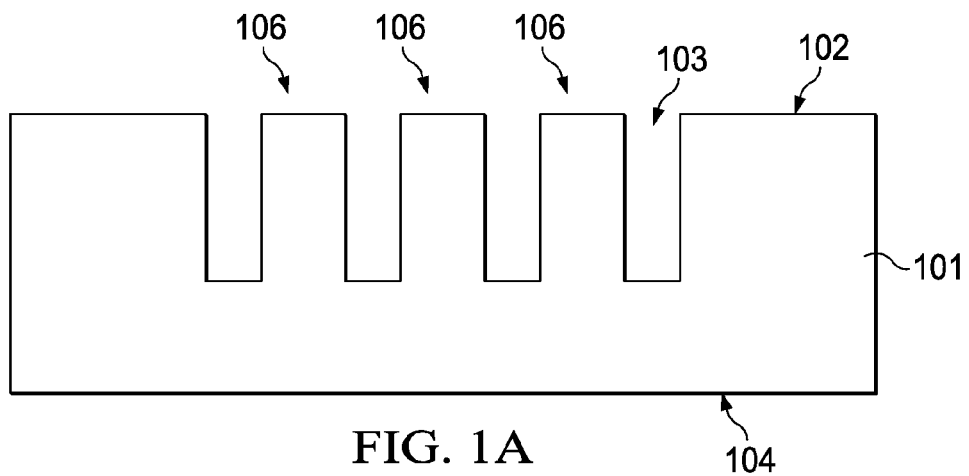
FIGS. 1A-1E illustrate process steps to singulate a wafer using a temporary fill material and removing the temporary fill material from a back side of the wafer in accordance with an embodiment of the present invention.

With reference now to FIG. 1A, there is shown a semiconductor wafer 101. The wafer 101 generally comprises a plurality of individual dies referred to generally by reference numeral 106, wherein each die 106 includes a substrate having electronic devices formed thereon as is known in the art. The substrate is typically covered with one or more dielectric layers and one or more conductive layers between dielectric layers. The conductive layers provide connectivity and routing for the underlying electronic devices.

The semiconductor wafer 101 preferably has a first side 102 upon which the electronic devices and dielectric and metal layers are located. The wafer also preferably has a second side 104 located opposite the first side 102 and the electronic devices. The second side 104 preferably has no electronic devices located on it.

Between the individual dies 106, the wafer 101 is etched to form scrub lines 103. These scrub lines 103 are positioned between the dies 106 at the desired point of separation. The scrub lines 103 are preferably formed using a suitable photolithographic process and a wet chemical etch. However, any suitable etching process, such as a dry etch, may alternatively be used. The scrub lines 103 are preferably formed to have a depth of at least the desired thickness of the individual dies 106 after a subsequent thinning process. In an embodiment the scrub lines 103 preferably have a depth of between about 25 μm and about 400 μm, with a more preferred depth of about 30 μm to 200 μm, and an even more preferred depth of about 150 um.

Figure 1B:
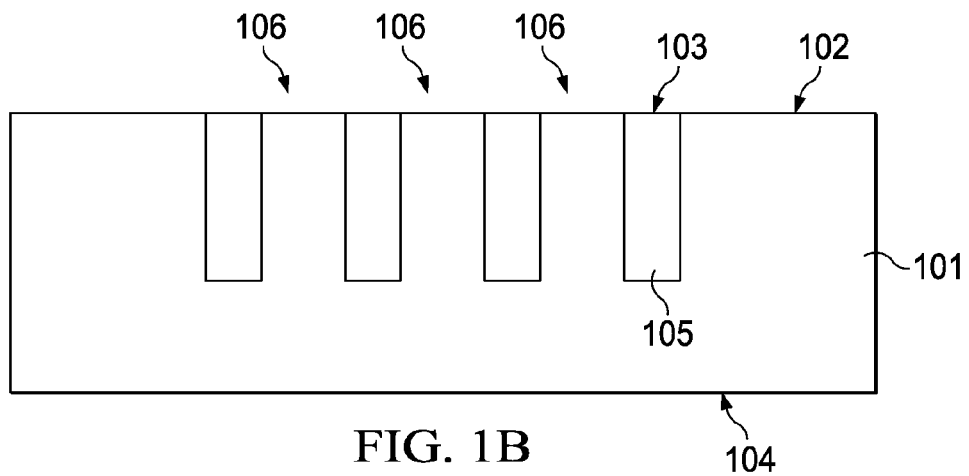

FIG. 1B illustrates the filling of the open scrub lines 103 with a temporary fill material 105. The temporary fill material 105 preferably comprises an adhesive such as polyethylene glycol (PEG) (such as PEG 1000, 4000, 6000, or 8000), but may alternatively be any suitable material whose phase can be changed between liquid (for formation) and solid (for protection). For example, materials such as wax or other suitable polymers, may alternatively be used besides PEG. The exact material used will, of course, be determined by the desired process conditions.

The temporary fill material 105 is preferably formed using PEG when it is in a liquid state. This is preferably performed by heating the PEG compound past its melting point such that it is a liquid. For example, PEG 1000 is preferably heated beyond its melting point of between 35-40° C., PEG 4000 is preferably heated beyond its melting point of between 53 and 58° C., PEG 6000 is preferably heated beyond its melting point of between 55 and 60° C., and PEG 8000 is preferably heated beyond its melting point of between 58 and 65° C.

Once the temporary fill material 105 is in a liquid state, the temporary fill material 105 is preferably applied to the wafer 101 using a spin process. In a spin process the liquid temporary fill material 105 is applied to the wafer 101 while the wafer 101 is spun around a central axis. The spinning helps the temporary fill material 105 flow into and fill the scrub lines 103.

Once the liquid temporary fill material 105 has completely filled the scrub lines 103, the phase of the liquid temporary fill material 105 is preferably changed into a solid phase. If PEG is being used as the temporary fill material 105, the phase change is preferably performed by lowering the temperature of the PEG below its melting point, thereby solidifying the temporary fill material 105. This reduction in temperature is preferably performed by allowing the temporary fill material 105 to come into equilibrium with the ambient temperature of the surrounding atmosphere. Alternatively, the wafer 101 and temporary fill material 105 may be placed into an atmosphere cooler than ambient so as to reduce the required time for solidification.

Alternatively, if a polymer is utilized as the temporary fill material 105, a curing process is preferably used instead of reducing the temperature below the polymer's melting point. To cure the polymer the wafer 101 and temporary fill material 105 are preferably placed into an oven. The wafer 101 and temporary fill material 105 are then cured at a temperature of greater than about 100° C. for a time period of about 10 min to about 60 min.

Once the temporary fill material 105 has been solidified, excess temporary fill material 105 is removed from the surface of the wafer 101 outside of the scrub lines 103. The temporary fill material 105 is preferably removed using a cleaning process that depends upon the material used. For example, if PEG is used as the temporary fill material 105, then a simple steam clean may be utilized to remove the excess temporary fill material 105. If a polymer is used then a suitable etchant may be used to remove the excess temporary fill material 105. Once completed, the temporary fill material 105 is preferably enclosed within the scrub lines.

Figure 1C:
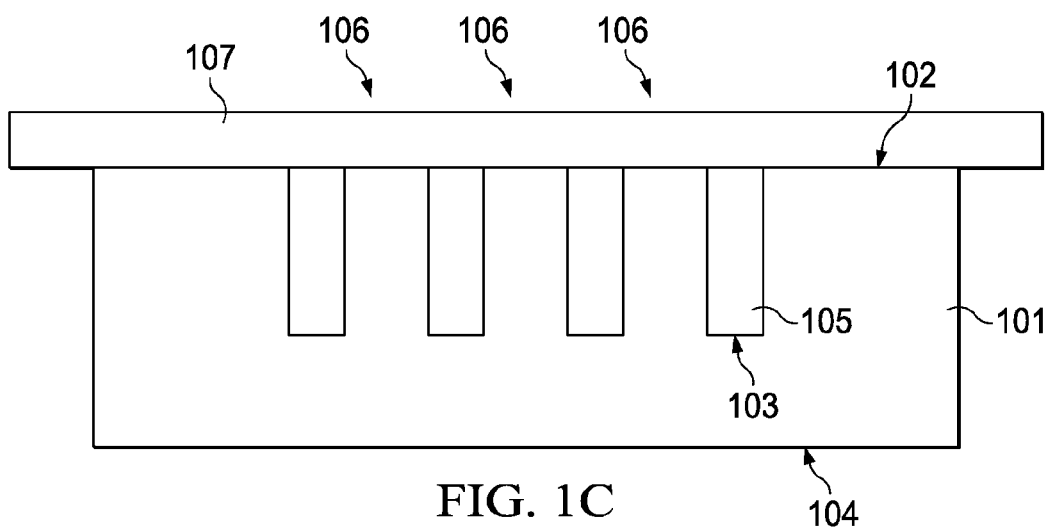

FIG. 1C illustrates the placement of a first cover 107 over the first side 102 of the wafer 101 and covering the scrub lines 103 on the first side of the wafer 101. The first cover 107 preferably holds the individual dies 106 in place after singulation. The first cover 107 preferably comprises a suitable carrier tape, such as the commonly known blue tape, and is preferably attached to the wafer 101 using a second adhesive on the blue tape.

Alternatively, the first cover 107 may be a carrier wafer. The carrier wafer may comprise, for example, glass, silicon oxide, aluminum oxide, and the like. In an embodiment, a second adhesive may be used to glue the carrier wafer to the first side 102 of the wafer 101. The second adhesive may be any suitable adhesive, such as an ultraviolet (UV) glue, which loses its adhesive property when exposed to UV lights. The preferred thickness of the carrier wafer is preferably greater than about 12 mils.

Figure 1D:
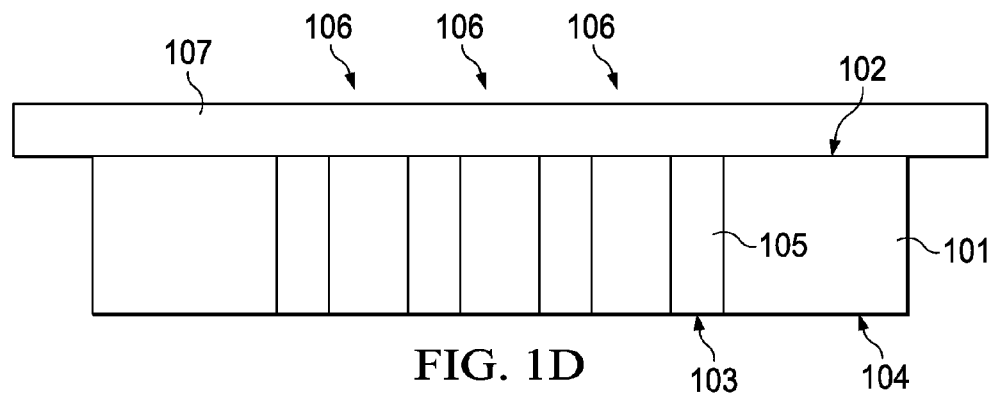

FIG. 1D illustrates the thinning of the second side 104 of the wafer 101 (the side opposite the scrub lines 103) to expose the scrub lines 103 and complete the separation of the individual dies 106 from each other. The thinning is preferably performed using a mechanical grinding process, such as grinding by a grinding wheel and/or chemical mechanical polishing (CMP) which uses a combination of chemical reactants and abrasive particles to grind the wafer 101. However, other suitable methods, such as a wet etch or a dry etch, may also be utilized to thin the second side 104 of the wafer 101 and expose the scrub lines 103 from the second side 104 of the wafer 101. An optional polishing step, such as another CMP, may additionally be performed once the wafer 101 has been thinned.

Figure 1E:
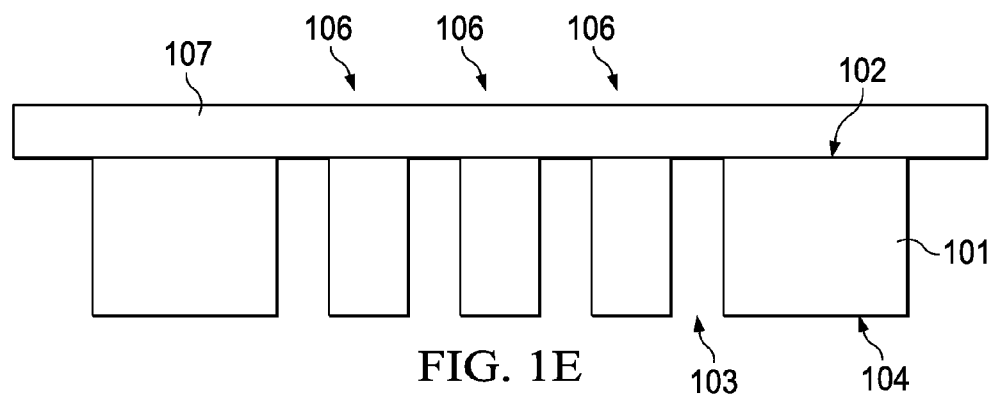

FIG. 1E illustrates the removal of the temporary fill material 105 from the scrub lines 103. The temporary fill material 105 is preferably removed by placing the wafer 101 and exposed temporary fill material 105 into a solvent bath such as a warm water bath to remove the temporary fill material 105 if the temporary fill material 105 is PEG. However, other suitable methods, such as a wet or dry etch, may alternatively be used for a temporary fill material 105 such as the polymer. The temporary fill material 105 is preferably exposed to the etchant without the removal of the first cover 107, so that the temporary fill material 105 is removed through the second side 104 of the wafer 101.

Once the temporary fill material 105 has been removed away from the scrub lines 103, the wafer 101 has been singulated into individual dies 106 and, once removed from the first cover 107, are ready for bonding. However, by using this preferred method, there are no particles that result from conventional wafer dicing using saws or particles from non-scrubbing. Accordingly, with fewer particles on the surface of the individual dies 106, there will be fewer bonding failures due to these particles, and overall yield will increase.

Figure 2A:
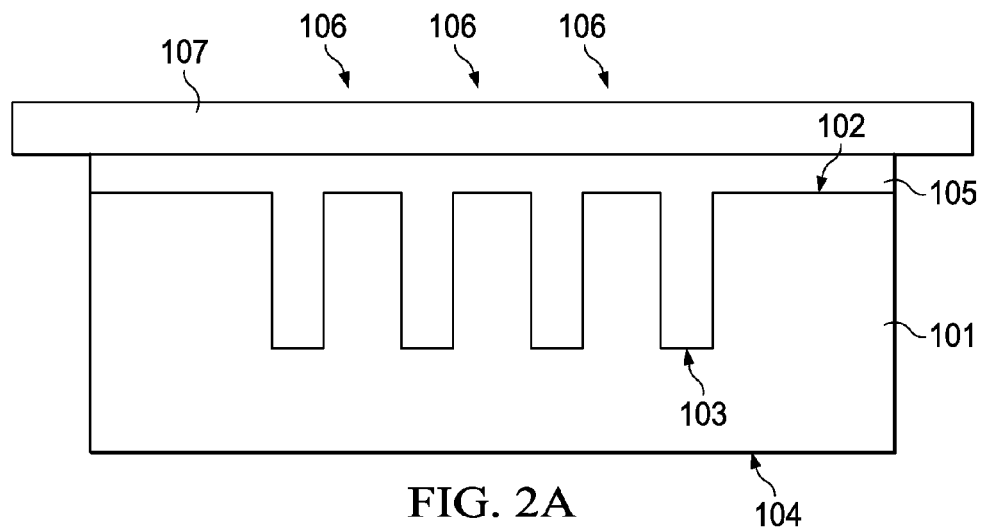
FIGS. 2A-2C illustrate a process to singulate a wafer using a temporary fill material and removing the fill material from a front side of the wafer in accordance with an embodiment of the present invention.

FIG. 2A illustrates another embodiment of the present invention in which a temporary fill material 105 is utilized to prevent particles from forming during the singulation of a wafer 101. In this embodiment the scrub lines 103 are etched similar to the embodiment described above with respect to FIGS. 1A-1E. However, during formation of the temporary fill material 105, the cleaning step to remove the temporary fill material 105 from the surface of the wafer 101 is not performed or else the temporary fill material 105 is not removed totally, so that the temporary fill material 105 fills not only the scrub lines 103 but also a majority of the surface of the first side 102 of the wafer 101.

After the temporary fill material 105 has been solidified as discussed above with respect to FIG. 1B, the first cover 107 is then attached to the temporary fill material 105 on the first side of the wafer 101. The first cover 107 is similar to the first cover described above with respect to FIG. 1C (e.g., may be either tape or a carrier), and may be attached to the solidified temporary fill material 105 through a similar manner (e.g., a second adhesive, not shown).

Figure 2B:
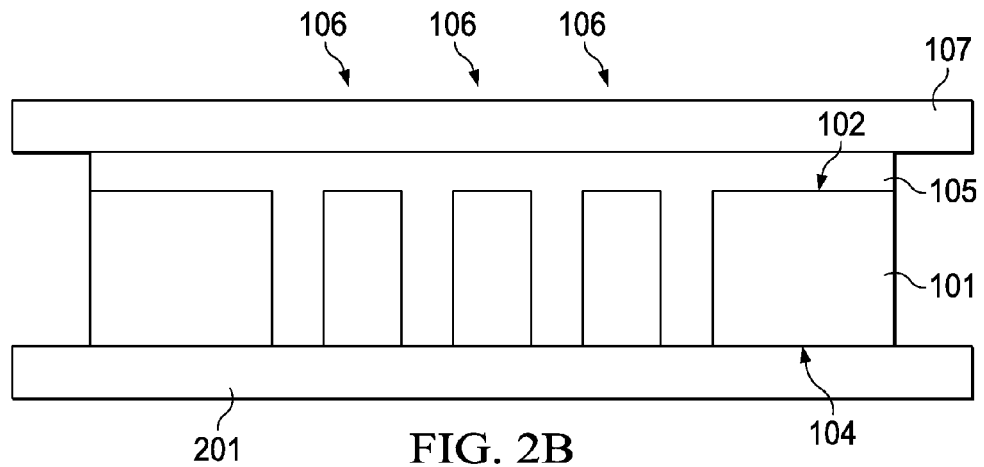

FIG. 2B illustrates the resulting structure after the second side of the wafer 101 (the side opposite the scrub lines 103) is thinned. The thinning process may be performed similar to the thinning process described above with respect to FIG. 1D (e.g., a grinding or etching process). Notably, this thinning process exposes the scrub lines 103 filled with the temporary fill material 105 from the second side of the wafer 101.

After the scrub lines 103 have been exposed, a second cover 201 is attached to the second side 104 of the wafer 101, covering the exposed scrub lines 103. The second cover 201 is similar to the first cover 107, utilizing similar materials and processes of attachment. Further, it should be understood that, while the first cover 107 and the second cover 201 are attached to the same wafer and may be similar to each other (e.g., the first cover 107 and the second cover 201 may both be either a tape or a carrier), the first cover 107 and second cover 201 may alternatively be different from each other (e.g., the first cover 107 may be a carrier while the second cover 201 may be a tape, or vice versa). Any combination of a tape or a carrier or other suitable materials is intended to be included in the present invention.

Figure 2C:
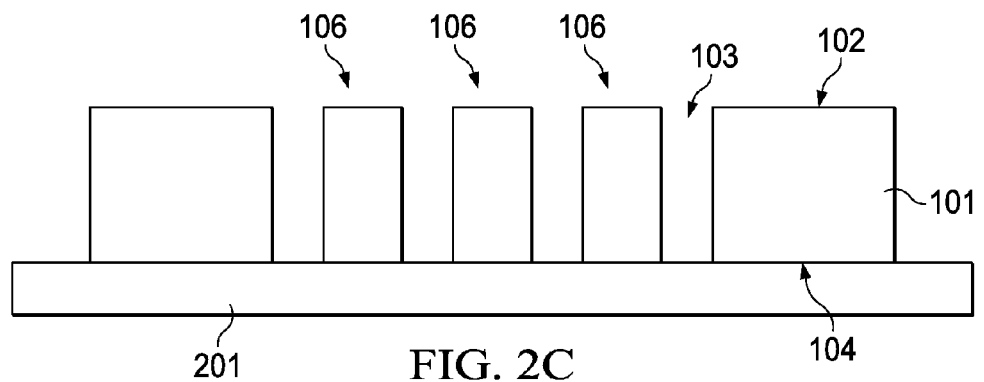

FIG. 2C illustrates that, once the second cover 201 has been attached to the second side of the wafer 101, the temporary fill material 105 is preferably removed. The temporary fill material 105 may be removed in a process similar to the removal process described above with respect to FIG. 1E (e.g., a warm water bath). However, in this process, because the first cover 107 is attached to the temporary fill material 105 and not to the wafer 101 itself, the removal of the temporary fill material 105 also causes the removal of the first cover 107. Alternatively, if desired, the first cover 107 may be removed first, followed by the removal of the temporary fill material 105. After the removal of the temporary fill material 105, the wafer 101 has been singulated into individual dies 106 which, upon removal from the second cover 201, are ready for further bonding.

Figure 3A:
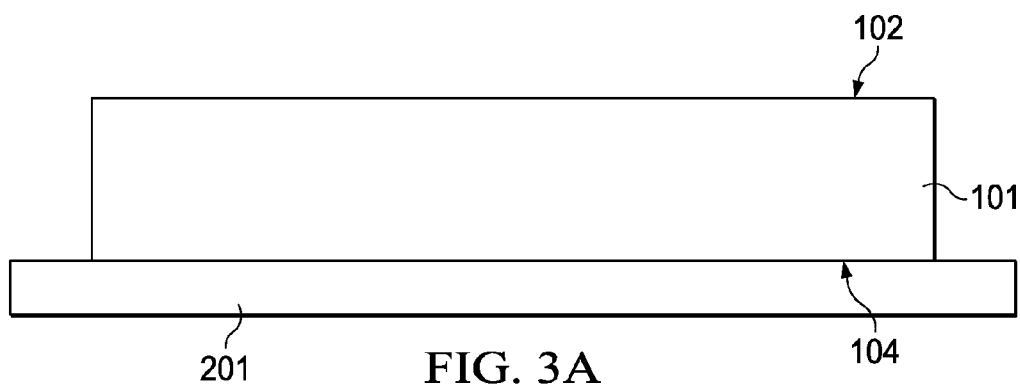
FIGS. 3A-3B illustrate a process to singulate a wafer by forming scrub lines through the wafer attached to a tape in accordance with an embodiment of the present invention.

FIG. 3A illustrates another embodiment of the present invention in which the wafer 101 is thinned prior to forming the scrub lines 103. In this embodiment, the wafer 101 is preferably thinned through a similar process as described above with respect to FIG. 1D (e.g., grinding) prior to the formation of the scrub lines 103. After the wafer 101 has been thinned, the second cover 201 is attached to the second side 104 of the wafer 101. The second cover 201 is similar to the second cover 201 described above with reference to FIG. 2B, and is attached in a similar fashion.

Figure 3B:
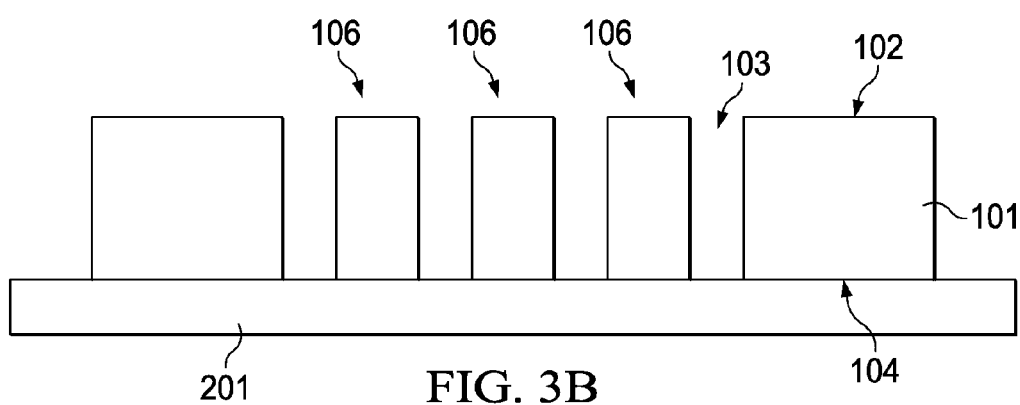

FIG. 3B illustrates the formation of scrub lines 103 through the wafer 101 after the second cover 201 has been attached to the second side of the wafer 101. The scrub lines 103 are formed in a similar fashion as described above with respect to FIG. 1A (e.g., etching), and the formation is continued until the scrub lines 103 extend all the way through the wafer 101, stopping at the second cover 201. After the scrub lines 103 are formed, the first side of the wafer 101 (which has been singulated) is exposed and singulated individual dies 106 are ready for wafer bonding once they have been removed from the second cover 201.

Figure 4A:
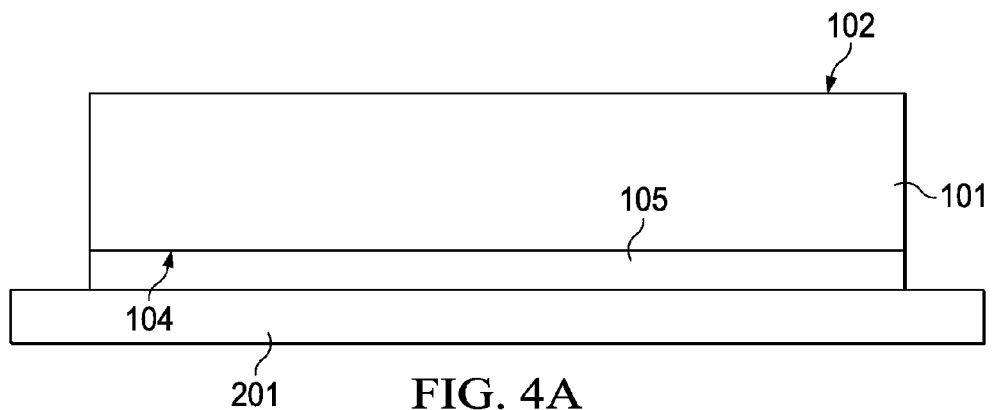
FIGS. 4A-4C illustrate a process to singulate a wafer by forming scrub lines through the wafer attached to a carrier using a fill material in accordance with an embodiment of the present invention.

FIG. 4A illustrates another embodiment of the present invention in which the wafer 101 is again thinned prior to forming the scrub lines 103. In this embodiment the temporary fill material 105 is preferably applied and solidified onto the second side 104 of the wafer 101 prior to the formation of the scrub lines 103. Once the temporary fill material 105 has been applied and solidified, the second cover 201, which is preferably similar to the second cover 201 described above with respect to FIG. 1C, is preferably attached to the temporary fill material 105.

Figure 4B:
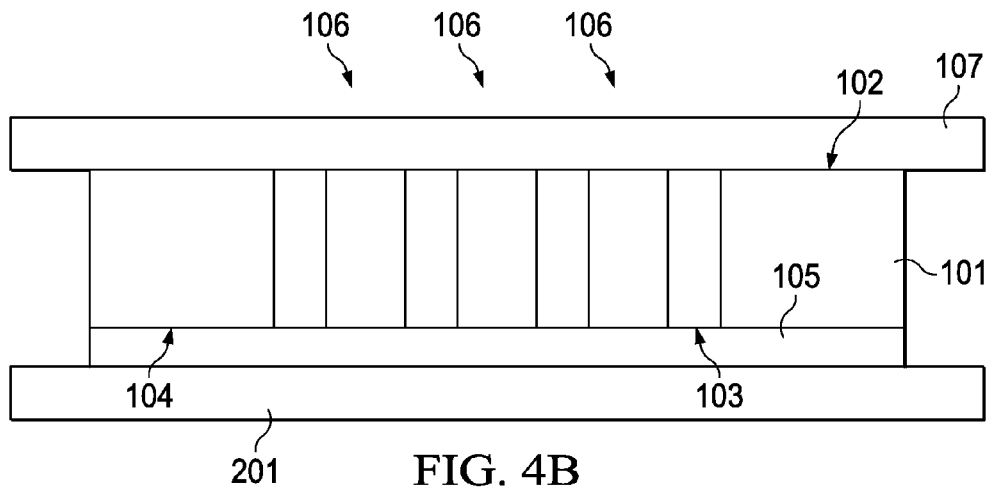
Figure 4C:
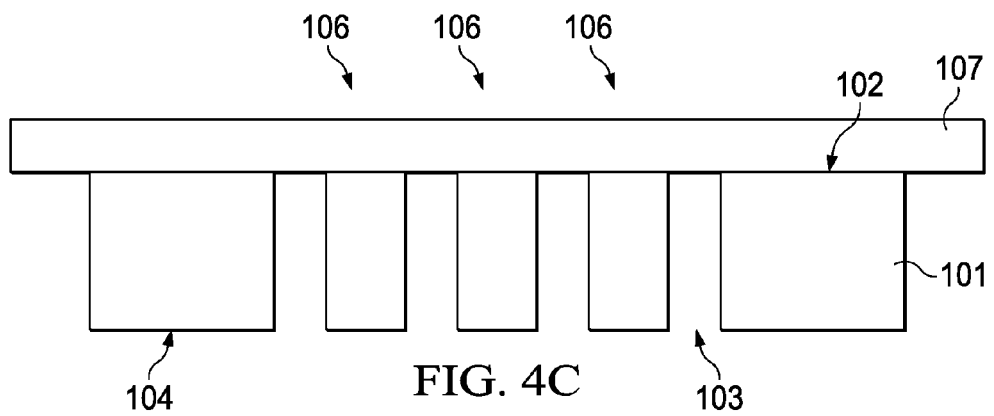

FIG. 4B illustrates that, after the second cover 201 has been attached to the second side 104 of the wafer 101, scrub lines 103 are formed through the first side 102 of the wafer 101 and the first cover 107 is attached to the first side of the wafer 101. The scrub lines 103 are formed through a suitable photolithographic and etching process as described above with respect to FIG. 1A. However, because the wafer 101 has been thinned prior to the formation of the scrub lines 103, the scrub lines 103 in this embodiment extend completely through the wafer 101 and stop at the temporary fill material 105 attached to the second side of the wafer 101.

After the scrub lines 103 have been formed through the wafer 101, the first cover 107 is attached to the first side of the wafer 101. The first cover 107 is preferably similar to the first cover 107 described above with respect to FIG. 1C. Once the first cover has been attached, the temporary fill material 105 is preferably removed as described above with respect to FIG. 1E, also preferably removing the second cover 201. At this point the second side 104 of the now singulated wafer 101 is exposed and the individual dies 106 have been singulated from the wafer 101 and are ready for wafer bonding.

These embodiments allow for the singulation of individual dies from a semiconductor wafer while protecting the die from particles that may be formed during the singulation process. By hampering the formation and deposition of these particles, subsequent bonding of the die will have a higher yield, thereby increasing the overall yield of the fabrication process.

Although the present invention and its advantages have been described in detail, it should be understood that various changes, substitutions and alterations can be made herein without departing from the spirit and scope of the invention as defined by the appended claims. For example, any suitable temporary fill material that works to protect the scrub lines from particle formation and/or deposition may alternatively be utilized, and is not limited to simply those materials listed herein.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for separating dies from a wafer, the method comprising:

providing a semiconductor wafer;
forming a plurality of openings in a first side of the semiconductor wafer;
filling the plurality of openings with a fill material;
attaching a first cover over the fill material;
thinning a second side of the semiconductor wafer opposite the first side, the thinning exposing the fill material; and
removing the fill material from the plurality of openings by contacting the fill material with a fluidic removal agent, the removing the fill material occurring after the thinning.

2. The method of claim 1, wherein the fill material is additionally located between the first cover and the first side of the semiconductor wafer.

3. The method of claim 1, wherein the first cover is attached to the semiconductor wafer.

4. The method of claim 1, wherein the first cover comprises a tape.

5. The method of claim 1, wherein the first cover comprises a carrier.

6. The method of claim 1, further comprising attaching a second cover over the thinned second side of the semiconductor wafer, wherein the removing is performed after the attaching.

7. The method of claim 1, wherein the fill material is removed from the plurality of openings through the second side of the semiconductor wafer.

8. The method of claim 1, wherein the fill material comprises an adhesive.

9. The method of claim 1, wherein the fill material comprises polyethylene glycol.

10. A method for singulating a wafer, the method comprising:
providing a wafer;
forming scrub lines at least partially through the wafer, the scrub lines being formed on a first side of the wafer;
applying a fill material to the wafer such that the fill material at least partially fills the scrub lines;
attaching a first cover over the first side of the wafer;
removing a portion of the wafer on a second side to substantially expose the fill material within the scrub lines, the second side being opposite the first side; and
removing the fill material from the scrub lines by dissolving the fill material.

11. The method of claim 10, wherein the first cover is a tape.

12. The method of claim 10, wherein the first cover is a carrier.

13. The method of claim 10, wherein the first cover is attached to only the fill material.

14. The method of claim 10, wherein the first cover is attached to the first side of the wafer.

15. The method of claim 10, wherein removing the fill material from the scrub lines is performed at least in part by removing the fill material from the first side of the wafer.

16. The method of claim 10, wherein removing the fill material from the scrub lines is performed at least in part by removing the fill material from the second side of the wafer.

17. The method of claim 10, further comprising attaching a second cover over the thinned second side of the semiconductor wafer.

18. A method for separating a portion of a wafer, the method comprising:
providing a wafer with a first side and a second side, the wafer comprising a first section and a second section to be separated;
forming an opening on the first side at least partially through the wafer between the first section and the second section;
at least partially filling the opening with a first material;
attaching a first cover over the first side of the wafer;
thinning the second side of the wafer;
attaching a second cover over the second side of the wafer; and
removing the first material from the opening by contacting the first material with a solvent.

19. The method of claim 18, further comprising overfilling the opening with first material and attaching the first cover to the first material.

20. The method of claim 18, further comprising removing the first material from the opening through the first side of the wafer.

* * * * *